(12) United States Patent
Brown et al.

(10) Patent No.: US 8,860,091 B2
(45) Date of Patent: Oct. 14, 2014

(54) GROUP III-N HFET WITH A GRADED BARRIER LAYER

(75) Inventors: David F. Brown, Woodland Hills, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/448,348

(22) Filed: Apr. 16, 2012

(65) Prior Publication Data

US 2013/0270572 A1 Oct. 17, 2013

(51) Int. Cl.
*H01L 31/072* (2012.01)

(52) U.S. Cl.
USPC .................. 257/195; 257/E29.246; 257/192; 257/24

(58) Field of Classification Search
USPC ................ 257/195, 192, 194, 24, E29.246
See application file for complete search history.

(56) References Cited

U.S. PATENT DOCUMENTS

| | | | |
|---|---|---|---|
| 8,212,290 B2 * | 7/2012 | Heikman et al. ............. | 257/195 |
| 2005/0077541 A1 | 4/2005 | Shen | |
| 2007/0194354 A1 | 8/2007 | Wu | |
| 2010/0289067 A1 | 11/2010 | Mishra | |
| 2011/0024796 A1 | 2/2011 | Miyoshi | |
| 2011/0057198 A1 | 3/2011 | Fujiwara et al. ............. | 257/76 |

OTHER PUBLICATIONS

PCT International Search Report and Written Opinion mailed on Jul. 10, 2013 from the corresponding PCT application, Application No. PCT/US2013/035525 (9 pages).
Palash Das et al., "Gate leakage current reduction with advancement of graded barrier AlGaN/GaN HEMT," Journal of Nano- and Electronic Physics. Dec. 2011, vol. 3, No. 1, pp. 972-978.
Borges, et al., "Simulations provide additional insights into GaN HFET reliability", Technology Transistor Modeling, Institute of Physics and IOP Publishing Ltd., 2006.
Chapter II PCT International Preliminary Report on Patentability (IPRP) mailed on Apr. 7, 2014 from the corresponding PCT application, Application No. PCT/US2013/035525.

* cited by examiner

*Primary Examiner* — Michael Shingleton
(74) *Attorney, Agent, or Firm* — Ladas & Parry

(57) ABSTRACT

A device and a method of making said wherein the device wherein the device has a group III-nitride buffer deposited on a substrate; and a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which varies at least throughout a portion of said group III-nitride barrier layer.

21 Claims, 2 Drawing Sheets

GROUP III-N HFET WITH A GRADED BARRIER LAYER

CROSS REFERENCE TO RELATED APPLICATIONS

None.

TECHNICAL FIELD

A group III-N Heterojunction Field Effect Transistor (HFET) with a graded barrier layer which yields improved RF performance for mm-wave devices.

BACKGROUND

A HFET (also known as a High Electron Mobility Transistor (HEMT)) is a field effect transistor incorporating a junction between two materials with different band gaps (i.e., a heterojunction) as the channel instead of a doped region as is generally the case for metal oxide silicon filed effect transistors (MOSFETs).

FIG. 1a depicts a conventional GaN HFET device structure with a buffer 10 of AlGaN disposed on a substrate 8. Buffers 10 of GaN are also known in the prior art. The channel layer 12 is a 40 nm thick layer of GaN and the barrier layer 14 is a 21 nm thick layer of uniform $Al_{0.25}Ga_{0.75}N$. While the layers shown in FIG. 1a are all Un-Intentionally Doped (UID) layers, it is known in the art to add some doping to some of these layers or to layers disposed between these layers. See, for example, Fujiwara "Technique for Development of High Current Density Heterojunction Field Effect Transistors based on (10-10)-Plane GaN By Delta-Doping" US Patent Publication 2011/0057198.

The structure of FIG. 1a is depicted before a gate structure is formed thereon. For higher frequency devices, the gate structure is typically a T-gate.

FIG. 3a depicts pulsed-IV measurements with $V_{gs}$=+1V and a 200 ns pulse-width of the conventional device of FIG. 1a. The current-collapse taken at $V_{ds}$=2V is 35% for the conventional device of FIG. 1a.

Current collapse has long been an issue for microwave and millimeter-wave AlGaN/GaN HFETs. Transistors can exhibit a phenomenon known as current collapse, where channel conductance is temporarily reduced after exposure to high voltage. This problem is typically mitigated by using SiN surface passivation. The gate is then fabricated by etching its foot through the SiN and then evaporating and lifting off the gate using a separate lithography step. This prior art process naturally creates a field-plate, and the resulting device is quite useful for frequencies up to the Ka band (26.5-40 GHz).

However, limitations on the gate length and parasitic capacitance introduced by the field plate preclude this process from being used for still higher frequencies. To reduce capacitances while having a short gate length, a "T-gate" structure is typically used. Unfortunately, T-gate devices typically have worse current collapse than field-plated devices because of inherent differences in the passivation process and changes to the E-field profile at the drain-edge of the gate of the device. This remains a major problem for high-frequency group III-nitride devices, particularly for GaN-based devices which can be used at frequencies above the Ka band.

Achieving good power performance at frequencies above the Ka band requires new approaches in the technology. First, T-gates should be used to achieve short gate length with low parasitic capacitance. However, it becomes more difficult to have good passivation of the surface traps with a T-gate process compared with a more conventional field-plated approach. The result is often a very high level of current collapse, which greatly limits output power and efficiency that is achievable in a power amplifier. This is a major limitation which prevents mainstream adoption of GaN HFETs in V-band and W-band applications.

The present invention reduces the level of current collapse compared to the techniques used in the prior art.

BRIEF DESCRIPTION OF THE INVENTION

In one aspect the present invention provides a transistor having a group III-nitride buffer deposited on a substrate; and a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which (i) remains essentially constant throughout a first portion of said group III-nitride barrier layer and (ii) varies at least throughout a second portion of said group III-nitride barrier layer.

In another aspect the present invention provides a method of making a transistor, comprising: forming a group III-nitride buffer deposited on a substrate; and forming a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which (i) remains essentially constant throughout a first portion of said group III-nitride barrier layer and (ii) varies at least throughout a second portion of said group III-nitride barrier layer.

In yet another aspect the present invention provides a method of reducing current collapse in a HFET device having a channel, a gate and a barrier region between the channel and the gate, the barrier region having aluminum (Al) as one of it constituent elements, the method comprising varying a mole fraction of the aluminum (Al) in only a portion said barrier region so that the barrier region has a higher mole fraction of aluminum (Al) closer to said gate than more remote from said gate.

In yet another aspect the present invention provides a HFET device which has a channel, a gate and a barrier region between the channel and the gate and means for reducing current collapse, wherein where channel conductance is temporarily reduced after exposure to high voltage, the means for reducing current collapse including the element aluminum (Al) in said barrier region wherein the aluminum (Al) in said barrier region has a mole fraction which initially remains constant in a portion of said barrier region next to said channel but which varies so that the barrier region has a higher mole fraction of aluminum (Al) closer to said gate than more remote from said gate.

BRIEF DESCRIPTION OF THE DRAWINGS

FIG. 1a shows the epitaxial structure of a conventional HFET device while

DETAILED DESCRIPTION

Figure 1A:
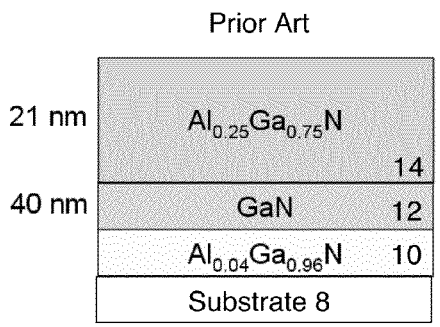
Figure 1B:
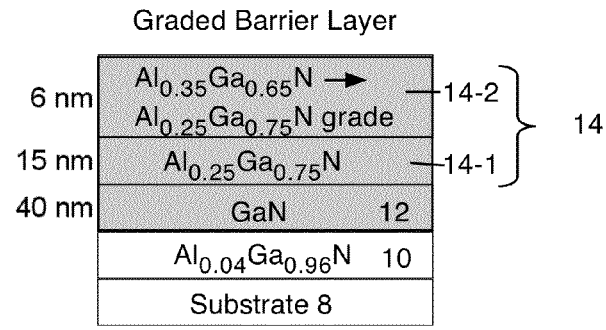
FIG. 1b shows the epitaxial structure of a HFET device having a graded barrier portion in its barrier layer as opposed to a uniform or homogeneous barrier.

FIG. 1a shows the conventional device structure mentioned above. FIG. 1b shows an improved HFET device, having a barrier 14 which includes a graded barrier layer 14-2 as opposed to the uniform barrier 14 of the device of FIG. 1a.

In one embodiment of the graded device, the graded device has a barrier layer 14 comprising two layers 14-1 and 14-2, one of which is preferably uniform and the other of which is preferably graded. Layer 14-1 is preferably a 15 nm thick uniform layer of AlGaN, which is disposed on or above the channel layer 12. The uniform AlGaN layer 14-1 in this embodiment is followed by graded layer 14-2, which is preferably a 6 nm thick layer of AlGaN in which the Al mole fraction is graded from 25% to 35% (with the higher Al mole fraction preferably on the upper surface of buffer 14 adjacent gate 20—see FIG. 2).

Figure 4:
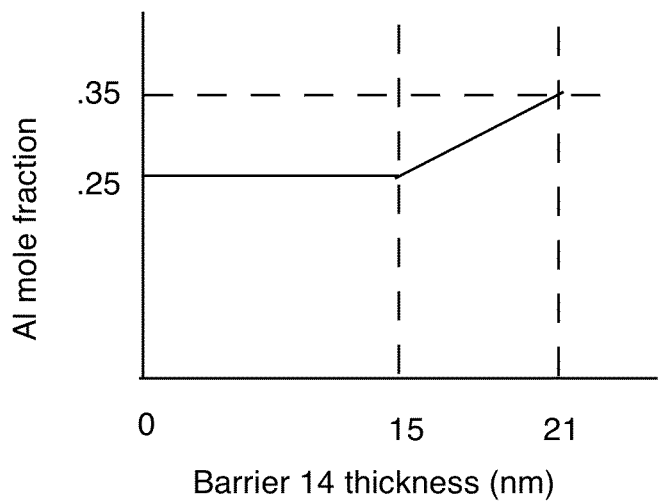
FIG. 4 is a graph of the preferred mole fraction of Al versus barrier thickness.

FIG. 4 is a graph of the preferred mole fraction of Al versus barrier thickness. These thicknesses and mole fractions may be varied as needed to suit the specific application in which a resulting HFET may be utilized. The graph of FIG. 4 shows a linear relationship between the mole fraction of Al and thickness between 15 and 21 nm, but non-linear relationships would also likely prove satisfactory. If InAlN is utilized as barrier 14 then the composition of the graded region 14-2 would preferably begin near $In_{0.17}Al_{0.83}N$ (since that mole fraction results in a lattice which is matched to a GaN channel 12) and increasing Al to $In_xAl_{1-x}N$ in the non-constant portion of a graph of Al mole fraction to barrier thickness, where x<0.17, again with the higher Al mole fraction preferably occurring on surface of buffer 14 adjacent gate 20. The mole fraction of the Al in the InAlN may vary from about $In_{0.17}Al_{0.83}N$ to about $In_{0.01}Al_{0.99}N$ throughout the thickness of layer 14-2, but preferably varies from about $In_{0.17}Al_{0.83}N$ to about $In_{0.07}Al_{0.93}N$ with the thickness of layer 14-2.

Figure 5:
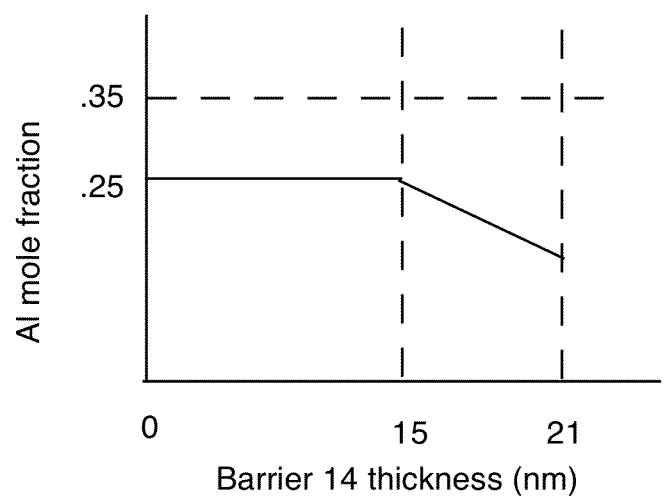
FIG. 5 is a graph of an embodiment where the mole fraction of Al versus barrier thickness also varies with a lower value of the mole fraction of Al occurring next to the gate.

The graph of FIG. 5 shows an alternative embodiment with grading in the opposite direction to that shown in FIG. 4. The HEMT device constructed as shown in FIGS. 1b and 2, but with the grading of FIG. 5 instead of the grading of FIG. 4, possessed no additional improvement to current-collapse, but such a device may have improved reliability.

The channel 12 is preferably a 40 nm thick layer of GaN and the buffer 10 is preferably AlGaN, although some alternative embodiments may utilize GaN instead as layer 10. The buffer 10 is disposed on a substrate 8 which is preferably SiC, but the substrate 8 may be made from other materials such as Si, sapphire, GaN, or other group III-Nitride materials. The thickness of the channel 12 may be varied as needed to suit the specific application that the resulting HFET is to be used in.

Figure 2:
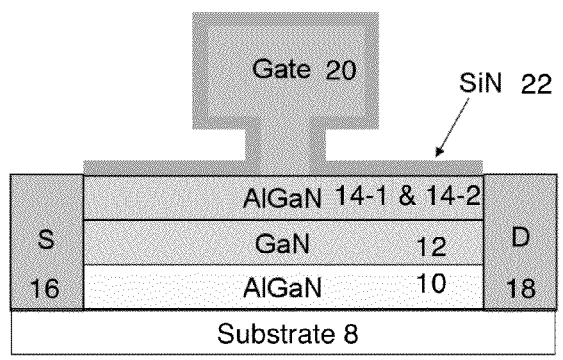
FIG. 2 is a cross-sectional view of the final device structure, having a Schottky T-gate and two ohmic contacts. The device is preferably passivated with SiN following gate fabrication.

FIG. 2 is a cross-sectional view of the final device with a Schottky T-gate 20 and two ohmic contacts 16, 18 which provide the source and drain contracts of the resulting HFET. The resulting HFET device is preferably passivated with SiN following gate fabrication with a thin layer of SiN 22. The final device preferably has a T-gate 20 as depicted by FIG. 2 although a field plated gate structure could be used instead, but it is believed that a field plated gate structure would have degraded high frequency performance compared to the device with a T-gate structure for the reasons previously stated.

Figure 3A:
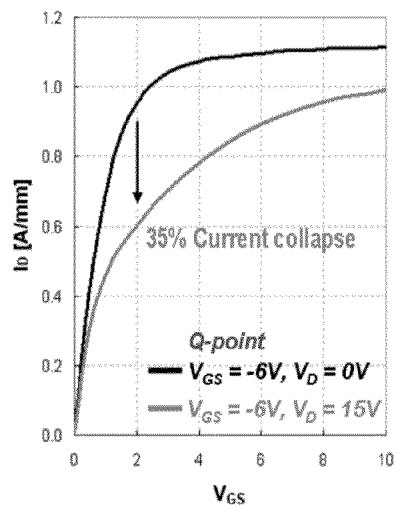
FIGS. 3a and 3b depicts pulsed-IV measurements with $V_{gs}$=+1V and a 200 ns pulse-width of both a conventional device (FIG. 3a) and a device with a graded-barrier (FIG. 3b). The current-collapse of each device (taken at $V_{ds}$=2V) is 35% and 9% respectively.
Figure 3B:
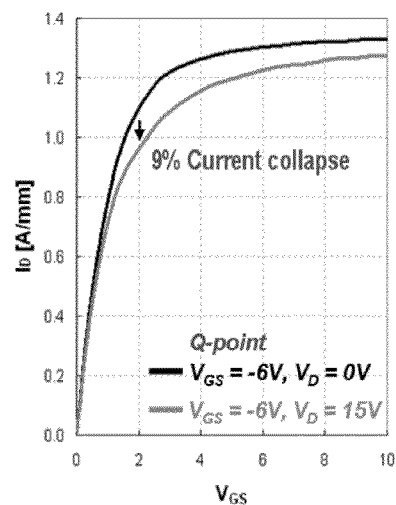

Current-collapse is typically characterized with a pulsed-IV measurement. Data for the epitaxial structures of FIGS. 1a and 1b are shown in FIGS. 3a and 3b, respectively. Current-collapse is 35% for the conventional structure of FIG. 1b, but only 9% for the structure of FIG. 1b with a graded barrier 14-2. This is a significant improvement in performance and will significantly improve the performance of Radio Frequency (RF) Monolithic Microwave Integrated Circuits (MMICs) when incorporated therein.

Al, Ga, and In all belong to group III of the periodic table along with other elements. Group III-nitrides include GaN, InAlN, GaAlN, and other group III elements combined with Nitrogen as a nitride for semiconductive purposes. Layers 10, 12, 14-1 and 14-2 are preferably UID layers, but these layers may be doped, and more particularly, have doped regions inside or doped layers between them for reasons known in the art.

This invention has been described with reference to embodiments of a T-gate HFET. This invention disclosure should also prove useful for field-plated gate HFETs. These are more appropriate for low-frequency RF (<40 GHz) or power-switching applications than T-gate HFETs, but the graded barrier structure may have some advantages to device performance for field-plated gate HFETs as well This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device, comprising:
   a substrate;
   a group III-nitride buffer disposed on or above the substrate; and
   a group III-nitride heterostructure disposed on a surface of the group III-nitride buffer, wherein the group III-nitride heterostructure has a group III-nitride channel and a group III-nitride barrier layer disposed on a surface of the group III-nitride channel, the group III-nitride barrier layer including Al as one of its constituent group III elements, the Al having a mole fraction which (i) remains essentially constant throughout a first portion of said group III-nitride barrier layer and (ii) varies at least throughout a second portion of said group III-nitride barrier layer.

2. The device of claim 1 wherein the mole fraction of the Al in said second portion increases towards a surface of said barrier layer remote from the group III-nitride channel.

3. The device of claim 2 wherein a maximum mole fraction of the Al in said second portion occurs at the surface of said barrier layer remote from the group III-nitride channel.

4. The device of claim 2 wherein the group III-nitride barrier layer comprises AlGaN.

5. The device of claim 4 wherein the second portion of said group III-nitride barrier layer varies from approximately $Al_{0.25}Ga_{0.75}N$ to approximately $Al_{0.35}Ga_{0.65}N$ with the higher Al mole fraction occurring at said surface of said barrier layer remote from the group III-nitride channel and wherein the Al mole fraction in the first second portion of said group III-nitride barrier layer remains essentially constant at approximately $Al_{0.25}Ga_{0.75}N$.

6. The device of claim 5 wherein the group III-nitride buffer is $Al_{0.04}Ga_{0.96}N$ and wherein the group III-nitride channel is GaN.

7. The device of claim 4 wherein the AlGaN of said group III-nitride barrier layer is unintentionally doped.

8. The device of claim 5 wherein the substrate comprises SiC, sapphire, Si or GaN.

9. The device of claim 2 wherein the III-nitride barrier layer comprises InAlN.

10. The device of claim 9 wherein the second portion of said group III-nitride barrier layer varies from approximately $In_{0.17}Al_{0.83}N$ to $In_{0.07}Al_{0.93}N$ with the higher Al mole fraction occurring at said surface of said barrier layer remote from the III-nitride channel.

11. The device of claim 10 wherein the group III-nitride buffer is $Al_{0.04}Ga_{0.96}N$ and wherein the group III-nitride channel is GaN.

12. The device of claim 9 wherein the InAlN of said group III-nitride barrier layer is unintentionally doped.

13. The device of claim 1 where the device is a HFET and wherein a T-gate structure is disposed on the group III-nitride barrier layer.

14. A HFET device comprising: a channel, a gate and a barrier region between the channel and the gate and means for reducing current collapse in said channel, the means for reducing current collapse in said channel comprising aluminum in said barrier region wherein the aluminum in said barrier region has a mole fraction which initially remains constant in a portion of said barrier region next to said channel but which varies in another portion of said barrier region spaced from said channel so that the barrier region has a higher mole fraction of aluminum closer to said gate than more remote from said gate.

15. The HFET device of claim 14 wherein the barrier region comprises a AlGaN layer which the Al mole constant remains essentially constant at approximately $Al_{0.25}Ga_{0.75}N$ for a first distance adjacent said channel and thereafter varies during a second distance remote from said channel from approximately $Al_{0.25}Ga_{0.75}N$ adjacent said channel to approximately $Al_{0.35}Ga_{0.65}N$.

16. The HFET device of claim 15 wherein the first distance is approximately 15 nm and the second distance is approximately 6 nm.

17. The HFET device of claim 15 wherein the first distance is more than twice the size of the second distance.

18. The HFET device of claim 14 wherein the barrier region comprises a InAlN layer which the Al mole constant remains essentially constant at approximately $In_{0.07}Al_{0.83}N$ for a first distance adjacent said channel and thereafter varies during a second distance remote from said channel from approximately $In_{0.07}Al_{0.83}N$ adjacent said channel to approximately $In_{0.01}Al_{0.99}N$.

19. The HFET device of claim 18 wherein the first distance is approximately 15 nm and the second distance is approximately 6 nm.

20. The HFET device of claim 18 wherein the first distance is more than twice the size of the second distance.

21. The device of claim 1 wherein the first portion has a first depth over first the Al mode fraction remains essentially constant and the second portion has a second depth over which the Al mode fraction varies, said first depth being more than twice the size of said second depth.

* * * * *